United States Patent [19]

Tsuji et al.

[11] 4,375,100

[45] Feb. 22, 1983

[54] METHOD AND APPARATUS FOR ENCODING LOW REDUNDANCY CHECK WORDS FROM SOURCE DATA

[75] Inventors: Shiro Tsuji, Minoo; Hiroshi Matsushima, Hirakata; Yasuharu Shimeki, Suita; Nobuyoshi Kihara, Amagasaki; Misao Kato, Neyagawa, all of Japan

[73] Assignee: Matsushita Electric Industrial Company, Limited, Osaka, Japan

[21] Appl. No.: 199,703

[22] Filed: Oct. 23, 1980

[30] Foreign Application Priority Data

Oct. 24, 1979 [JP] Japan ............................. 54-137122
Feb. 29, 1980 [JP] Japan ............................... 55-25588
Jun. 11, 1980 [JP] Japan ............................... 55-79558

[51] Int. Cl.³ .............................................. G06F 11/10
[52] U.S. Cl. ....................................... 371/38; 371/50; 371/51
[58] Field of Search ...................... 371/38, 37, 40, 50, 371/51

[56] References Cited

U.S. PATENT DOCUMENTS

| | | | |
|---|---|---|---|
| 3,800,281 | 3/1974 | Devore et al. | 371/38 |
| 3,913,068 | 10/1975 | Patel | 371/38 |
| 4,052,698 | 10/1977 | Ragle | 371/38 |
| 4,201,976 | 5/1980 | Patel | 371/50 |
| 4,205,324 | 5/1980 | Patel | 371/50 |
| 4,206,440 | 6/1980 | Doi et al. | 371/38 |
| 4,211,997 | 7/1980 | Rudnick et al. | 371/38 |
| 4,238,852 | 12/1980 | Iga et al. | 371/38 |

FOREIGN PATENT DOCUMENTS 2012460A 7/1979 United Kingdom .

*Primary Examiner*—Charles E. Atkinson
*Attorney, Agent, or Firm*—Lowe, King, Price & Becker

[57] ABSTRACT

Source data is organized by a time compression memory (4) into a plurality of successive groups of data words arranged in a pattern of rows and columns with the rows corresponding to respective recording tracks. A plurality of successive groups of parity check words is provided in the same pattern of rows and columns as the data words subsequent to the data word groups. Each parity check word is derived in a parity generator (6) by modulo-2 summations from the data words selected from different data word groups. The data and check words of each row of each respective group are (a) preceded by a synchronization code provided by a sync generator (10) to allow differentiation between data and parity groups, and (b) followed by a cyclic redundancy check, (CRC) code provided by a CRCC generator (9) to allow detection of an error in that data row or check words. The parity check word is used to correct an error specified by the CRC code upon detection of an error.

14 Claims, 13 Drawing Figures

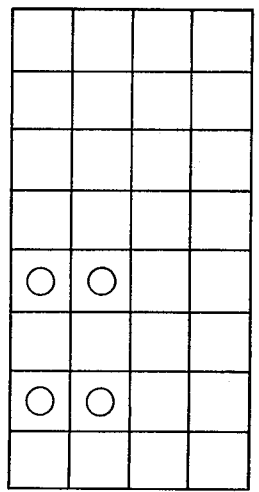
FIG. 10
FIG. 9
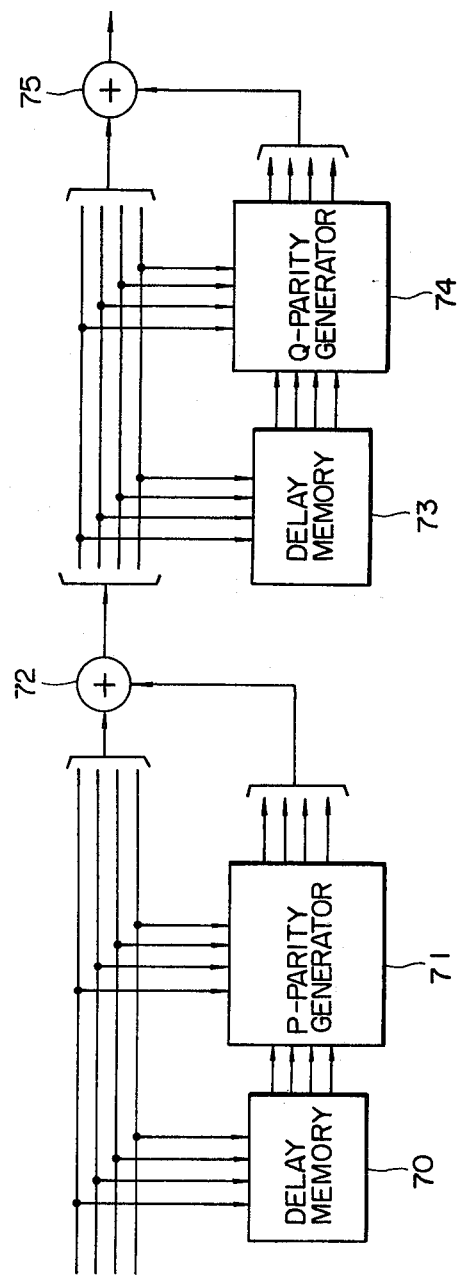
FIG. 13

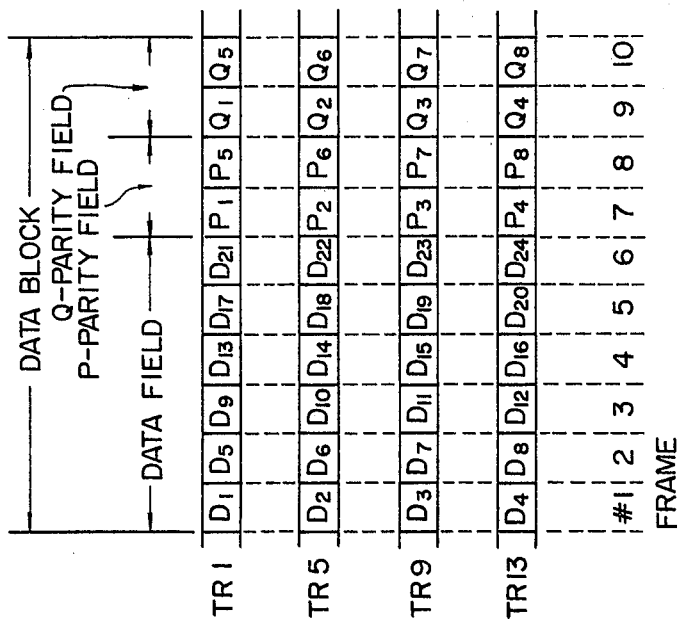

METHOD AND APPARATUS FOR ENCODING LOW REDUNDANCY CHECK WORDS FROM SOURCE DATA

BACKGROUND OF THE INVENTION

The present invention relates to method and apparatus for encoding source data into a data block format composed of data words and parity check words derived from selected data words. The invention is particularly useful for purposes of editing digital audio signals recorded in magnetic recording medium.

Various attempts have been made to reduce the error rate of magnetically recorded digital signals due to dropouts which occur in the recording medium by encoding check words from source data to form a data block such that upon reproduction of the recorded signals errors may be detected and corrected. In the prior art attempts error correcting check words are inter-mixed with associated data words. This results in a substantial increase in redundancy with the attendant increase in high data density in a recording medium. Stated differently, the spatial frequency of the recorded data bits increases to the point where complex system would be required. The degree of redundancy is usually determined in considering the nature of source data such as video signal, audio signal or computer data or the like in relation to the error rate of the recording medium employed. It is of particular importance to design a data format of high error correction capability under the imposed limitations of redundancy.

Electronic editing, on the other hand, is currently employed because of its advantage in that it permits transcription of a recorded audio program from one tape to another without the need for cutting off the tapes and joining them together. Due to inherent fluctuations of tape drive systems, it is almost impossible to precisely join the data bits at the editing point which are spaced a distance of several micrometers. Thus it would be necessary to discard a full data block in which the editing point occurs since that block is rendered invalid as a whole. To avoid this problem, a prior art approach provides an interblock gap (IBG) between successive data blocks to permit a editing point to occur therein. This method, however, has poor coding efficiency.

SUMMARY OF THE INVENTION

Accordingly, an object of the present invention is to provide a method of and apparatus for encoding check words from source data which ensure correction of errors with a high degree of certainty without increasing redundancy.

Another object of the invention is to provide a method of and apparatus in to encoded check words are grouped into a single parity field within a data block separate from groups of data words.

A further object of the invention is to provide a method and apparatus in which parity check words are arranged in the direction of tape motion to permit electronic editing to be performed in the location of parity check words to avoid loss of data words.

According to the invention, digital source data is converted into a plurality of groups of data words arranged in a pattern of rows and columns with the rows corresponding to the respective recorded tracks. The data words of each row are preceded by a synchronization code and followed by a cyclic redundancy check code (CRCC) which is derived by dividing the preceding data words of that row by a polynomial to permit detection of errors in the associated row data words. A parity check word is derived by modulo-2 summations, or exclusive-or functions, from the data words which are selected from different data word groups. Such parity check words are formed into a plurality of groups of a row-and-column pattern identical to that pattern of data words and inserted in a location subsequent to the data word groups. The parity check words of each row are preceded by a synchronization code and followed by a CRC code (CRCC). If a single error occurs in a CRCC word group, the error is correctable by bit inversion by the associated parity check word. If more than one error occurs in a CRCC word group, the errors are uncorrectable by the parity check word. The uncorrectable errors can be corrected by interpolation.

A higher error correcting capability is achieved by the provision of first and second parity check words respectively arranged in a separate parity field. Each of the first parity check words is derived by modulo-2 summations from data words arranged in each column, and each of the second parity check words is derived by modulo-2 summations from diagonally arranged data words of different data word groups. One of the parity word groups is arranged at a location subsequent to the data word groups and the other group is arranged along a separate row parallel to the rows of data words. If two of the first parity combinations of data words contain respectively two errors which also form part of errors in two of the second parity combinations of data words, such errors are "uncorrectable" and interpolation is employed for approximation. Electronic editing can be made at a point in one of the parity groups to avoid the loss of data words.

In a multi-channel audio system, data words of each channel are recorded in tracks which are interleaved with the tracks of the other channels, so that the data words of each track of a given channel are spaced a distance of n tracks from adjacent tracks of the same channel (where n is the number of tracks assigned to each channel). This data format serves to reduce the occurrence of errors in the same channel data words.

BRIEF DESCRIPTION OF THE DRAWINGS

The prevent invention will be further described by way of example with reference to the accompanying drawings, in which:

FIG. 9 is an illustration of the modulo-2 combinations of data words for $Q_1$, $Q_2$ and $Q_3$ parity check words and associated P-parity check words arranged in a pattern of rows and columns with the circle indicating the location of the errors in one of worst cases;

FIG. 10 is an illustration of the data words of FIG. 9 in the case of uncorrectable errors with the designation of data words being omitted for simplicity;

FIG. 11 is an illustration of another data format which is a modification of the data format of FIG. 5;

FIG. 12 is an illustration of data and check words of P- and Q-parity modulo-2 combinations of FIG. 11 arranged in a pattern of rows and columns; and FIG. 13 is an illustration of a block diagram which provides encoding of check words according to the format of FIG. 11.

DETAILED DESCRIPTION

Figure 1:
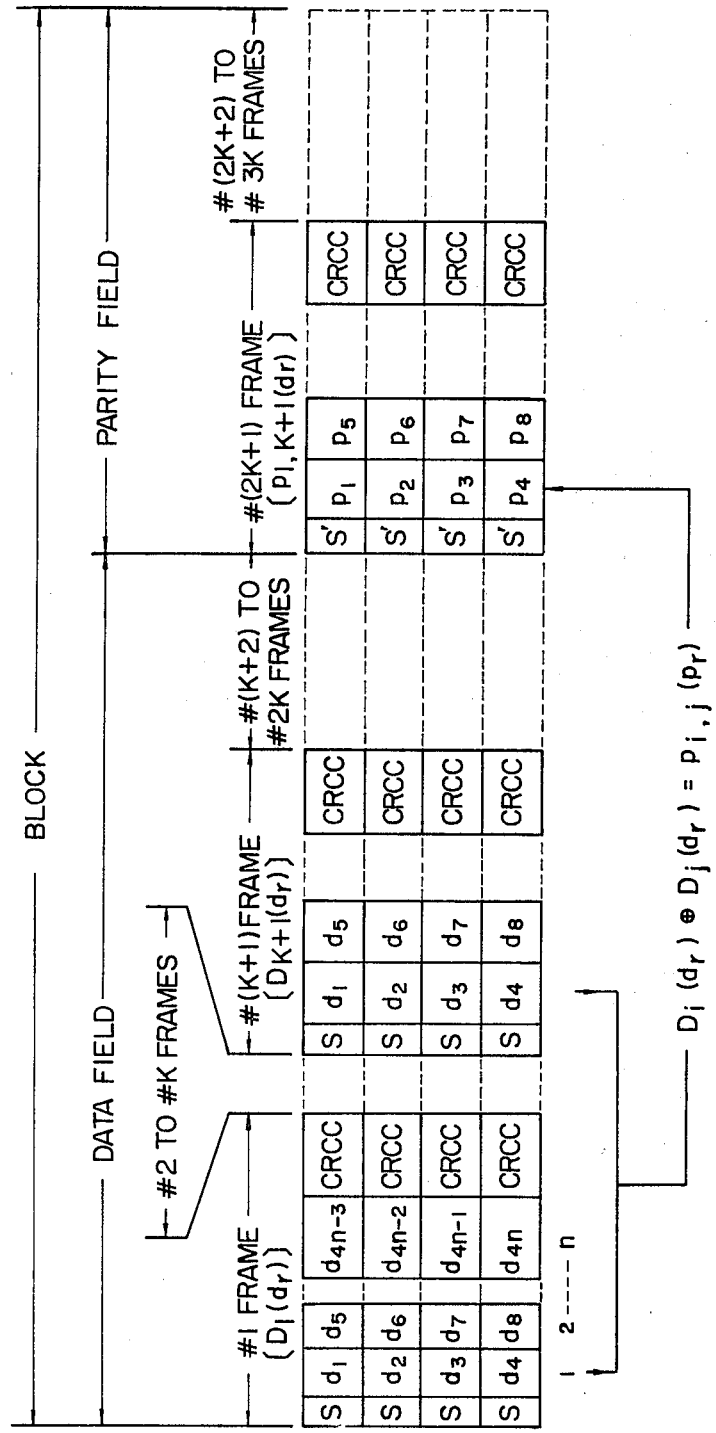
FIG. 1. is an illustration of a data format according to a first embodiment of the invention.

FIG. 1 is an illustration of a recording format of a data block recorded on a magnetic tape according to the coding scheme of a first embodiment of the invention. The data block is divided into a data field and a parity field. The data field is in turn subdivided into 2K frames of data words assigned to the #1 to #2K frame positions where K is an integer equal to or greater than unity and the parity field is subdivided into K frames of parity check codes, or correction codes assigned to the #(2K +2) to #3K frame positions. Time serial intelligence data words "d" are recorded into tracks #1 to #4 in a direction transverse to the direction of motion of the tape to form a data frame of row-and-column pattern, with the subscript indicating the order of occurrence of each data word. Each data frame further comprises a plurality of frame synchronization codes S of a predetermined bit pattern allocated respectively to the first column and a plurality of error detection cyclic redundancy check codes (CRCC's) allocated respectively to the last column. Each parity frame is composed of parity check codes $P_{i,j}(p_r)$ which are generated by modulo 2 addition of the data words of each column of the #i data frame and the data words of a corresponding column of the #j data frame, as expressed by the following equation:

$$D_i(d_r) \oplus D_j(d_r) = P_{i,j}(p_r) \quad (1)$$

where i ranges from unity to K and j ranges from K+1 to 2K, and r ranges from unity to 4n (where n is the number of columns in each frame). More specifically, parity check words $P_{i,K+1}(p_1)$, $P_{1,K+1}(P_2)$, $P_{1,K+1}(p_3)$ and $P_{1,K+1}(p_4)$ are each derived from data words $d_1$ to $d_4$ of the #1 data frame and data words $d_1$ to $d_4$ of the #(K+1) data frame, respectively. Likewise, parity check codewords of the last column of the #(2K+1) frame are generated from the data words of the last column of the #1 frame and the data words of the last column of the #K frame, and parity check codewords of the #3K frame are generated from the data words contained in the #K and #2K frames. Thus, the data words that form a parity check codeword are spaced a distance of K frames in the direction of motion of the tape. As in the data frames, the parity check codewords of each row are preceded by a frame synchronization code S' and followed by a cyclic redundancy check code. The frame synchronization code S' has a different bit pattern from the data frame synchronization code S to distinguish it from the latter.

Figure 2:
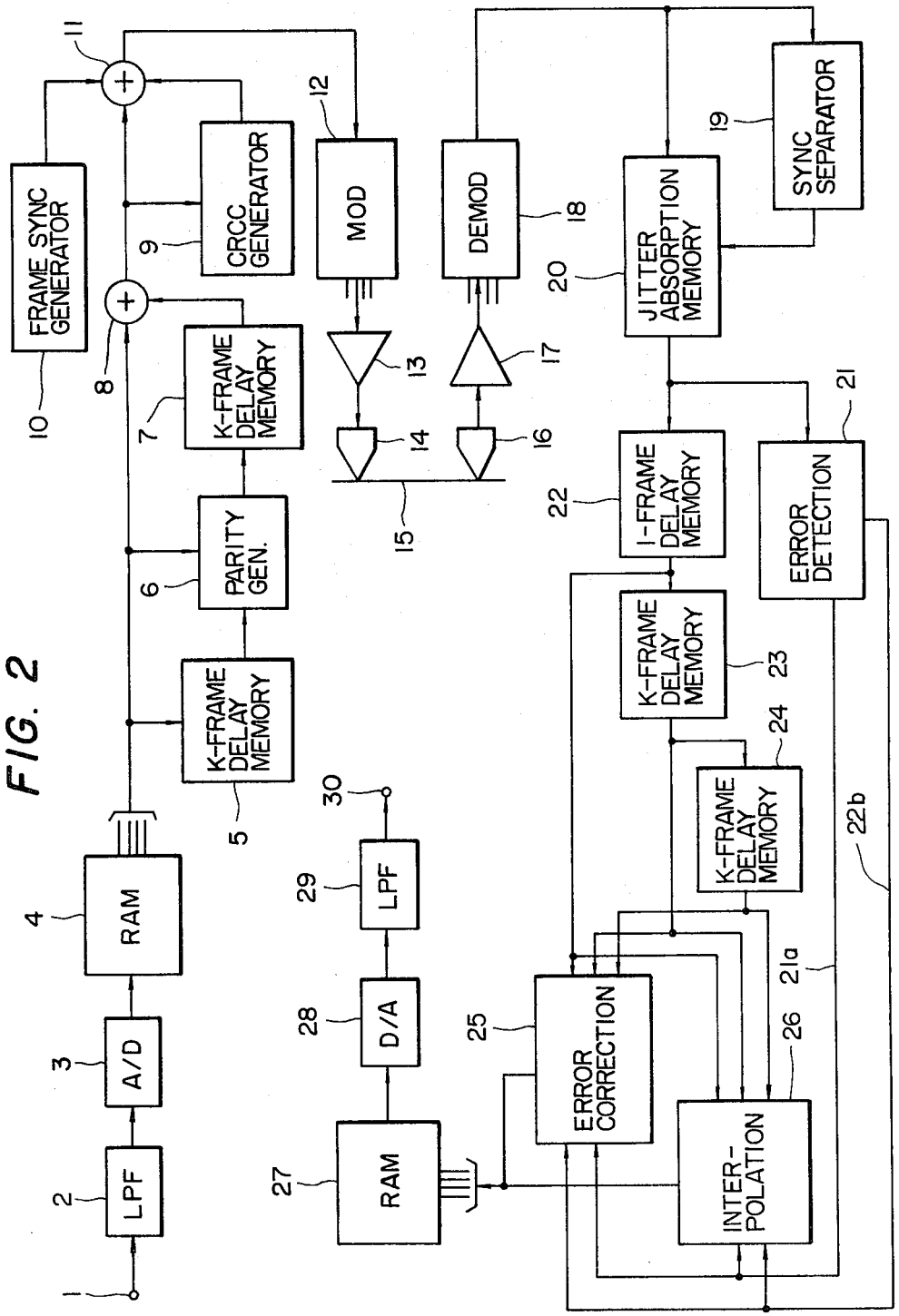
FIG. 2 is an illustration of a magnetic recording and reproducing system which encodes check words from source data according to the format of FIG. 1.

FIG. 2 is an illustration of a magnetic recording and reproducing system of the invention which carries out the coding operation according to the data format of FIG. 1. The system of FIG. 1 comprises a lowpass filter 2 which receives an analog signal from an input terminal 1 to eliminate unwanted signal components at frequencies higher than 20 kHz. The output of the lowpass filter 2 is applied to an analog-digital converter 3 for A-D conversion, the converter output being supplied to a random access memory 4 or time compression memory. Memory 4 is clocked by a common timing source (not shown) to write in the data words supplied from the converter in the direction of its columns in synchronism with the A-D conversion timing to store therein data words of one field in a pattern of four rows and 2Kn columns where n respresents the number of column data in each frame. The RAM 4 includes another data field in which subsequently generated data words are stored in the same manner and while writing the succeeding data; the RAM is driven to read out the preceding data field in the direction of rows on a per column basis to provide a set of four rows, or trains, of data words with the data trains corresponding respectively to the #1 to #4 recording tracks. Therefore, the retrieved data words are compressed in time domain to create time slots for later insertion of frame synchronization codes and CRCC and a parity frame to complete a data block.

A first delay memory 5 is connected to the outputs of time compression memory 4 to introduce a delay of K-frame intervals into the retrived data trains, the delayed data words being fed to a parity generator 6 of a known construction which is supplied with non-delayed data words provided by the memory 4. This parity generator 6 provides modulo-2 addition of each data word of the i-th frame and a corresponding row data word of the j-th frame to generate a parity check codeword $P_{i,j}(p_r)$. A set of four trains of parity codewords is thus generated and supplied to a second delay memory 7 in which the parity codewords are delayed by a K-frame interval, the delayed parity words being applied to a first mixing circuit 8 to which are also applied the non-delayed data words from memory 4. Thus, the parity check codewords are inserted in the #(2K+1) to #3K frame positions immediately following the preceding data words which occur in the #1 to #2K frames.

A CRCC generator 9, which essentially comprises shift registers and Exclusive-OR gates in a known manner, is connected to the outputs of the mixing circuit 8. This CRCC generator is designed to generate a polynomial code expressed by $X^{16}+X^{15}+X^2+1$ (which is generally employed in floppy disc and cassette tape recording) to divide each frame of row words by the generating polynomial. The remainder from the division operation is inserted into a time slot vacated by the compression memory following the last or n-th column of data and parity words of a corresponding row. This insertion is accomplished by a second mixing circuit 11 connected to the outputs of first mixing circuit 8 and to the outputs of CRCC generator 9. The second mixing circuit 11 is also connected to receive frame synchronization codes S and S' generated by a frame sync generator 10. These sync codes have different noncyclic bit patterns to allow data and parity frames to be distinguished from each other and are generated at appropricontrolled that the tape operation of the system in which the data is to be transferred is changed from the playback to the recording mode immediately following the termination of a data frame so that the succeeding parity frame is erased. Due to the loss of the parity frame, one or more errors in the associated data frames are detected as having two or more errors upon reproduction to allow interpolation circuit 26 to correct such errors by interpolation as described above.

Figure 4:
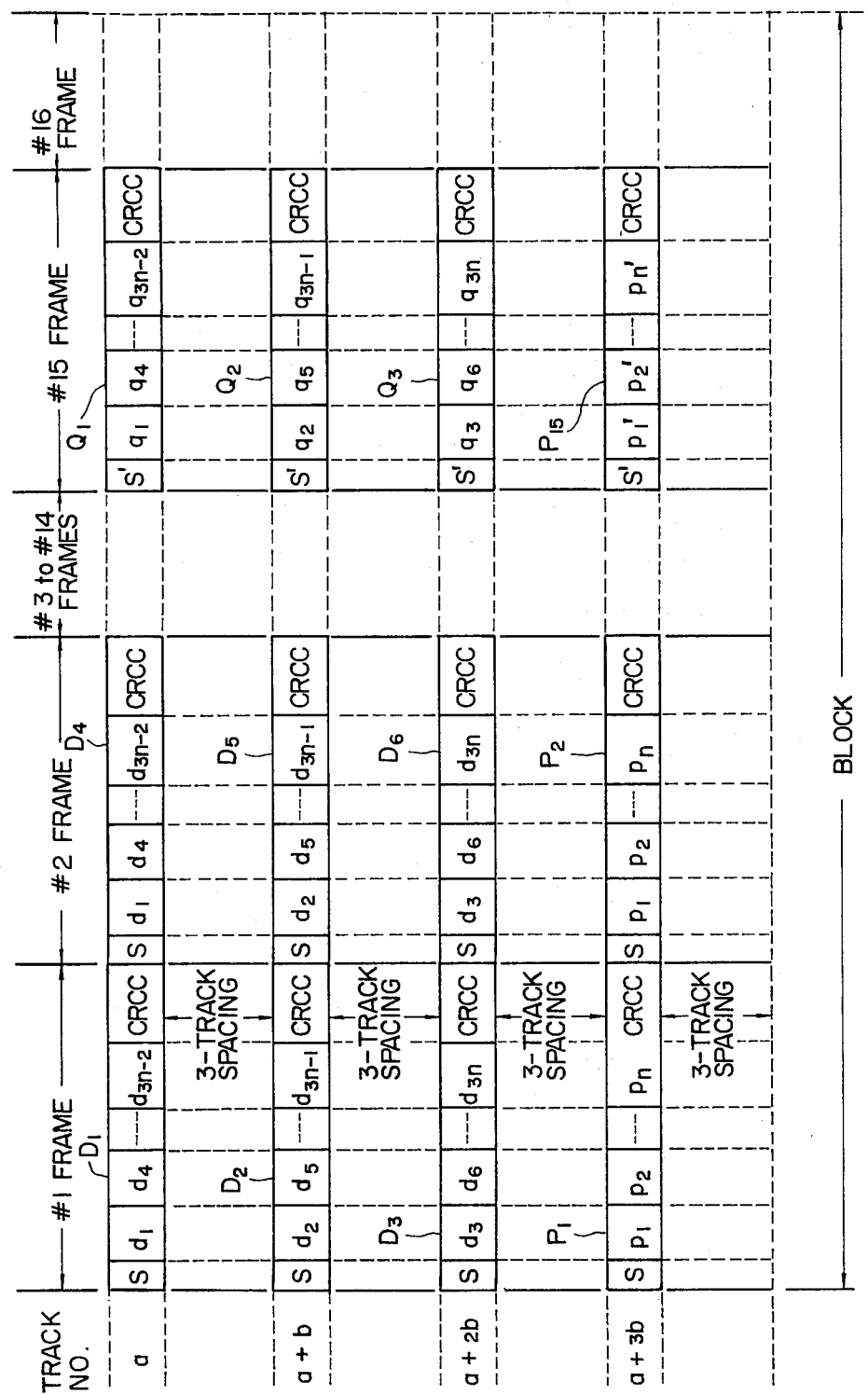
FIG. 4 is an illustration of a data format according to a second embodiment of the invention for a multi-channel data source.
Figure 5:
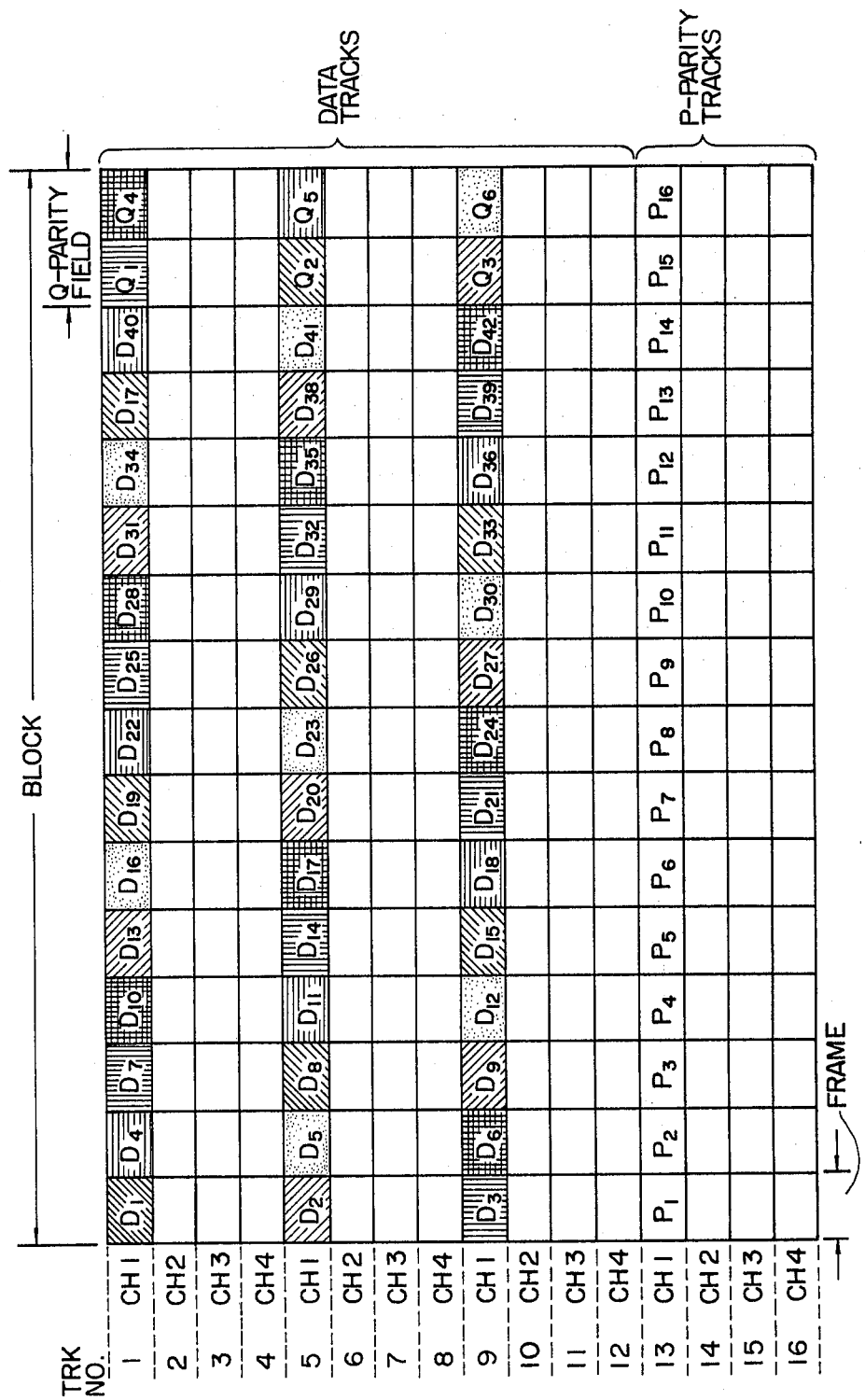
FIG. 5 is an illustration of the data format of FIG. 4 in which the modulo-2 combinations of data words are marked with different hatchings.

In accordance with a second embodiment of the invention, the data format is modified as shown in FIGS. 4 and 5. In this embodiment, the intelligence signal comprises a four-channel audio signal. However, for the sake of simplicity of explanation, description is made with respect to the #1 channel signal. As illustrated in FIG. 4, the first channel signal is converted into data words in a manner as described in the previous embodiment and assigned to three recording tracks rather than four tracks. Parity check words are provided respectively for data words of each column by the following modulo-2 summations:

$$d_1 \oplus d_2 \oplus d_3 = p_1 \\ d_4 \oplus d_5 \oplus d_6 = p_2 \qquad (2)$$

$$d_{3n-2} \oplus d_{3n-1} \oplus d_{3n} = p_n$$

The data words d of each row of a frame form a group data word $D_i$ (where i ranges from 1 to 42) and a set of three group data words $D_i$, $D_{i+1}$ and $D_{i+2}$ of each frame forms a frame data word. The parity check words p of each row of one frame length form a P-parity check word $P_j$ (where j ranges from 1 to 14). As described infra, Q-parity check words $Q_1$ to $Q_6$ are generated and assigned to three tracks of two frames #15 and #16. In addition, P-parity check words $P_{15}$ and $P_{16}$ are derived from the Q-parity words $Q_1$ to $Q_3$ and $Q_4$ to $Q_6$, respectively, and assigned to the same track as P-parity words $P_1$ to $P_{14}$ of the #15 and #16 frames. Each Q-parity word comprises q-parity bits, equal to the number of data words d in each group data word D. Each of the P-parity words $P_{15}$ and $P_{16}$ comprises p-parity bits $p_1'$ to $p_n'$ which are derived from the following equation:

$$q_1 \oplus q_2 \oplus q_3 = p_1' \\ q_4 \oplus q_5 \oplus q_6 = p_2' \qquad (3)$$

$$q_{3n-2} \oplus q_{3n-1} \oplus q_{3n} = p_n'$$

As in the previous embodiment, group data words D and P-parity words $P_1$ to $P_{14}$ are each preceded by a frame sync code S and followed by a CRCC, and Q-parity words and P-parity words $P_{15}$ and $P_{16}$ are each preceded by a frame sync code S' and a CRCC.

Group data words D and P- and Q-parity check words which are arranged in the direction of tracks are spaced a 3-track distance in a direction transverse to the track length, and each group of words in the track length is assigned to the #(a+mb) track where: a represents the channel number, b represents the number of tracks available for data words D and a P-parity word of each frame (four tracks in this example), and m is an integer ranging from zero to 3. Therefore, the data and parity words of the #1 channel signal are assigned to the #1, #5, #9 and #13 tracks.

Derivation of the Q-parity words is now be described with reference to FIG. 5. To derive a set of six Q-parity words $Q_1$ to $Q_6$, group data words $D_1$ to $D_{42}$ are grouped into a set of six combinations of similarly marked rectangular areas so that each combination comprises seven group of data words of diagonally arranged areas. More specifically, Q-parity words are derived by the following modulo-2 additions:

$$\left.\begin{array}{l} D_1(d_1) \oplus D_8(d_1) \oplus D_{15}(d_1) \oplus D_{19}(d_1) \oplus D_{26}(d_1) \\ \qquad \oplus D_{33}(d_1) \oplus D_{37}(d_1) = Q_2(q_1) \\ D_1(d_4) \oplus D_8(d_4) \oplus D_{15}(d_4) \oplus D_{19}(d_4) \oplus D_{26}(d_4) \\ \qquad \oplus D_{33}(d_4) \oplus D_{37}(d_4) = Q_2(q_4) \\ \vdots \\ D_1(d_{3n-2}) \oplus D_8(d_{3n-2}) \oplus D_{15}(d_{3n-2}) \oplus D_{19}(d_{3n-2}) \oplus D_{26}(d_{3n-2}) \\ \qquad \oplus D_{33}(d_{3n-2}) \oplus D_{37}(d_{3n-2}) = Q_2(d_{3n-2}) \\ D_2(d_2) \oplus D_9(d_2) \oplus D_{13}(d_2) \oplus D_{20}(d_2) \oplus D_{27}(d_2) \\ \qquad \oplus D_{31}(d_2) \oplus D_{38}(d_2) = Q_3(q_2) \\ \vdots \\ D_2(d_{3n-1}) \oplus D_9(d_{3n-1}) \oplus D_{20}(d_{3n-1}) \oplus D_{27}(d_{3n-1}) \\ \qquad \oplus D_{31}(d_{3n-1}) \oplus D_{38}(d_{3n-1}) = Q_3(q_{3n-1}) \\ \vdots \\ D_6(d_{3n}) \oplus D_{10}(d_{3n}) \oplus D_{17}(d_{3n}) \oplus D_{24}(d_{3n}) \oplus D_{28}(d_{3n}) \\ \qquad \oplus D_{35}(d_{3n}) \oplus D_{42}(d_{3n}) = Q_6(q_{3n}) \end{array}\right\} \qquad (4)$$

where, $D_1(d_1)$, inter alia, represents the data word $d_1$ of data word group $D_1$ (FIGS. 4 and 5).

It is seen from FIG. 5 that the data words that constitute each Q-parity word are displaced a distance of two frames in the longitudinal direction of the tape motion and further displaced a distance of N tracks in the transverse direction where N represents the number of channels, so that the spacing between the data words that form each P-parity word can be maximized.

Figure 6:
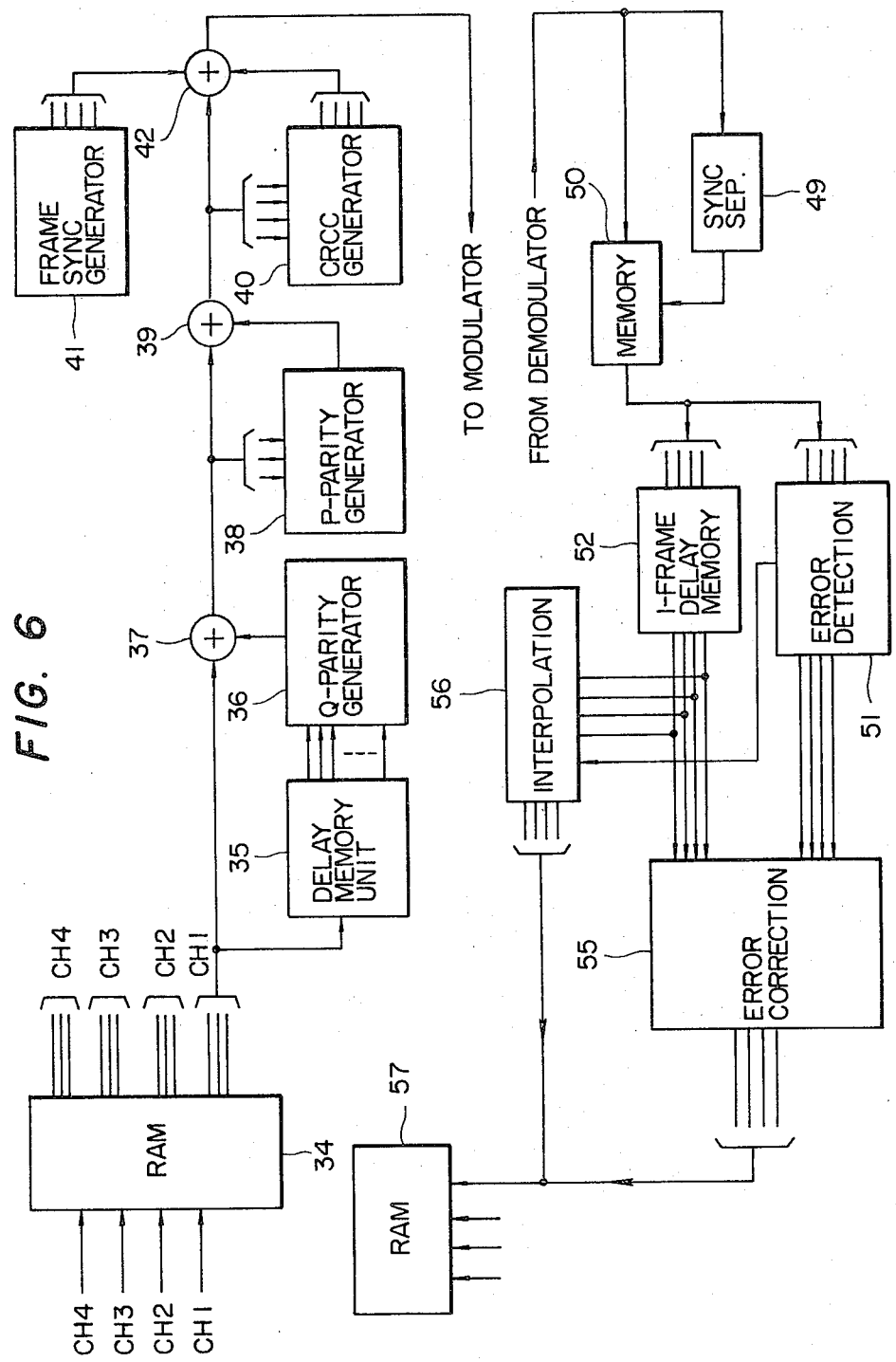
FIG. 6 is an illustration of a magnetic recording and reproducing system which encodes check words from source data according to the data format of FIGS. 4 and 5.

FIG. 6 is an illustration of a practical embodiment of the invention that carries out the coding explained above with reference to FIGS. 4 and 5. The system of FIG. 6 comprises a time compression RAM 34 which stores four-channel digitally converted signals from respective A-D converters, not shown. For simplicity of explanation the circuit for the #1 channel data is only illustrated, since the circuits associated with the other channel data are identical in construction to the #1 channel circuit. As in the previous embodiment, the #1 channel data is stored in the direction of columns indeate timing to allow insertion into respective time slots preceding the first column words of data and parity frames, thereby completing a data block as illustrated in FIG. 1.

A train of data blocks is thus generated and applied to a modulator 12 for converting the data into a form suitable for magnetic recording and reproduction. Specifically, a modified frequency modulation technique (which is extensively employed in magnetic recording) is implemented to take advantage of its capability to reduce the recording frequency to one-half the clock frequency. The frequency modulated data for each track is supplied via a respective linear amplifier 13 to a respective recording head 14 (one of four recording heads is shown for simplicity) located with respect to a magnetic tape 15.

During playback mode, the recorded digital signal on each track is detected by a respective playback head 16 and supplied to a demodulator 18 after amplification and waveshaping by a respective playback amplifier 17. Demodulator 18 converts the reproduced digital signals into non-return to zero data trains which are then fed into a sync separator 19. This sync separator 19 essentially comprise bit comparators to separate frame synchronization codes S and S' from the received data trains upon coincidence with the synchronization bit patterns. The separated sync codes are supplied to a jitter absorbing memory 20 to which are also applied the data trains from demodulator 18. This memory 20 is enabled in response to the outputs of sync separator 19 to initiate a writing operation upon the arrival of each data and parity frame. After one frame is stored in the memory 20, the latter is clocked by a frequency stabilized oscillator, not shown, to retrieve the stored frame words, so that the retrieved data contains no jitter components which might have been introduced due to fluctuations of the speed of tape motion known as wow and flutter.

The jitter-free data trains are supplied to an error-detection circuit 21 which generates a polynomial $X^{16}+X^{15}+X^2+1$ and divides the word bits of a frame to detect the presence of an error if the remainder of the division is not zero. When an error is detected, an error address code is generated indicating the frame and track numbers of the words in error. The error address code is applied to an error correction circuit 25 and to an interpolation circuit 26. Error detection circuit 21 further generates enabling signals which specify which one of correction circuit 25 and interpolation circuit 26 is to be enabled depending on the number and location of the error detected. More specifically, if one error is detected in one of the i-th and j-th data frames and the corresponding parity frame, a parity correction is effected in the correction circuit 25; if at least two errors are detected in these frames, interpolation circuit 26 is enabled to correct errors by interpolation. The error address code and enabling signals are applied respectively on leads 21a and 21b to the associated circuits.

The jitter-eliminated data trains are also presented to a 1-frame delay memory 22 and thence to a first input of error correction circuit 25 and to a K-frame delay memory 23. The effect of 1-frame delay memory 22 is to ensure that all the inputs to the correction circuit 25 and interpolation circuit 26 are aligned in phase with each other. The outputs of K-frame delay memory 23, which are delayed by an interval of K frames with respect to the data supplied to the first input of correction circuit 25, are supplied directly to a second input of error correction circuit 25 and to a second K-frame delay memory 24 to provide a further K-frame delayed data train to a third input of error correction circuit 25, so that the data words of the i-th and j-th frames and the parity check words of the corresponding frame are aligned in phase at the first to third inputs of correction circuit 25. More specifically, the parity codewords of the #(2K+1) to #3K frames at the first input of circuit 25 respectively appear in exact coincidence in time with the data words of the #(K+1) to #2K frames which appear at the second input and with the data words of the #1 to #K frames appearing at the third input.

In response to an enabling signal from error detection circuit 21 error correction circuit 25 generates a syndrome $S_{i,j}(s_r)=D_i(d_r)\oplus D_j(d_r)\oplus P_{i,j}(p_r)$ and provides inversion of all bits of the word in error.

Figure 3:
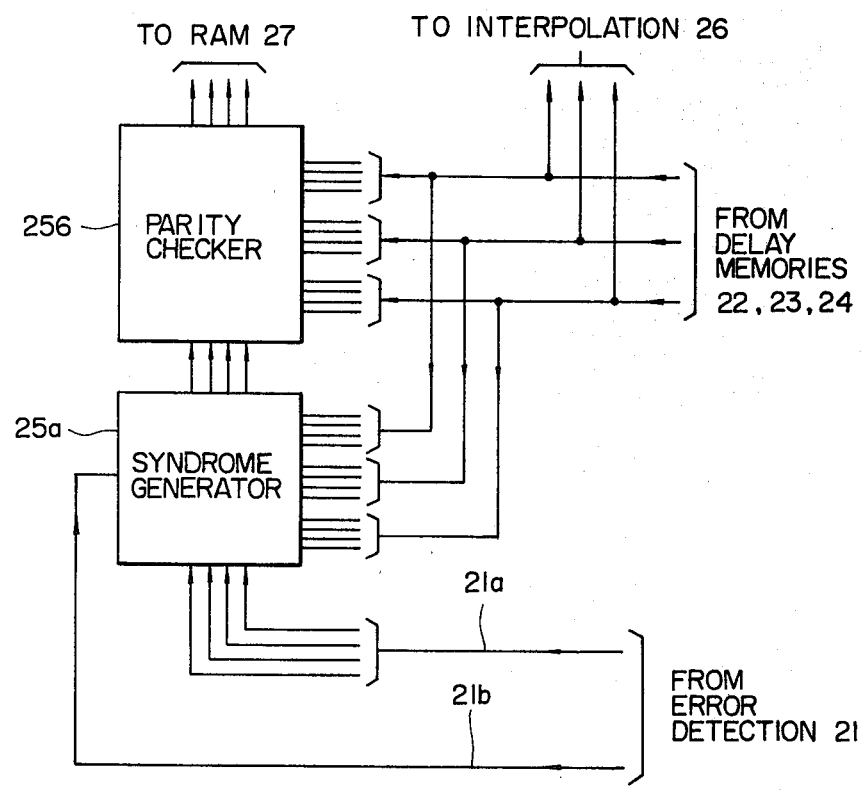
FIG. 3 is an illustration of details of the error correction circuit of FIG. 2.

In FIG. 3 details of the error correction circuit 25 are illustrated. Correction circuit 25 comprises a syndrome generator 25a and a parity checker 25b which receive the three sets of input data trains from delay memories 22, 23 and 24. Syndrome generator 25a is responsive to the error address code supplied on leads 21a to generate a corresponding syndrome when only one error is detected in the i-th and j-th data frames and the corresponding parity frame which is indicated by the enabling signal supplied to lead 21b by detection circuit 21. The generated syndrome is supplied to parity checker 25b. This parity checker interprets the received syndrome $S_{i,j}(s_r)$ in order to locate the word in error in the data trains received from the delay memories 22 to 24 and then proceeds with modulo-2 addition of $D_i(d_r) \oplus S_{i,j}(s_r)=D_i'(d_r)$, if an error occurs in the i-th frame, where $D_i'(d_r)$ is the correct data word. This is accomplished by inverting the incorrect data bit.

If errors were detected in at least two frames in the i-th and j-th data frames and the corresponding parity frame, the detection circuit 21 enables interpolation circuit 26 and transmits it as an address code indicating the location of row words which are adjacent to the incorrect words. Interpolation circuit 26 computes average values of the adjacent words for respective erroneous bits and substitutes them into the locations of the incorrect words.

The corrected data trains from the circuit 25 or 26 are applied to a time expansion RAM 27 (FIG. 2). If no error has been detected, the correction circuit 25 passes the input data trains directly to the RAM 27.

The RAM 27 is clocked to write in the data block in the direction of its rows. The stored data is then retrieved from memory 27 in the direction of its columns in succession from one column to the next. During this reading operation, the memory 27 is clocked to eliminate all the redundant bits. The retrieved data bits are fed to a digital-analog converter 28 and thence to a lowpass filter 29 which removes any noise generated during the D-A conversion and supplies the analog signal to an output terminal 30.

During electronic editing, two recording systems of FIG. 2 are employed with one of the systems operating in the playback mode in synchronism with the other which is also operating in the playback mode. When a desired data point or editing point is reached, the operator controls one of the recording systems to change from the playback mode to the recording mode to transcribe the data to the other systems. The selection of this editing point is performed electronically by means of a memory, not shown, in which a group of data around the editing point is stored. This memory is so pendently of the writing operations of the other channels and retrieved in the direction of rows on a per-column basis so that the retrieved data forms a set of three trains of 14 frames of data words $d_1, d_4 \ldots d_{3n-2}$ ($d_2, d_5, \ldots d_{3n-1} \ldots d_{3n}$) which are compressed in time dimension to accommodate redundant words. The output data in three trains for respective recording tracks are applied to a delay memory unit 35 and to a mixing circuit 37. As described infra, delay memory unit 35 introduces various delays each of which is an integral multiple of a 2-frame interval where the integer ranges from 1 to 7. A set of seven data trains is generated so that the data words that form the associated Q-parity word appear in phase at the inputs of a Q-parity generator 36 to permit the latter to produce Q-parity codewords $Q_1$ to $Q_6$ at appropriate time slots; code words $Q_1$ to $Q_6$ are then inserted into the three data trains by mixing circuit 37.

Figure 7:
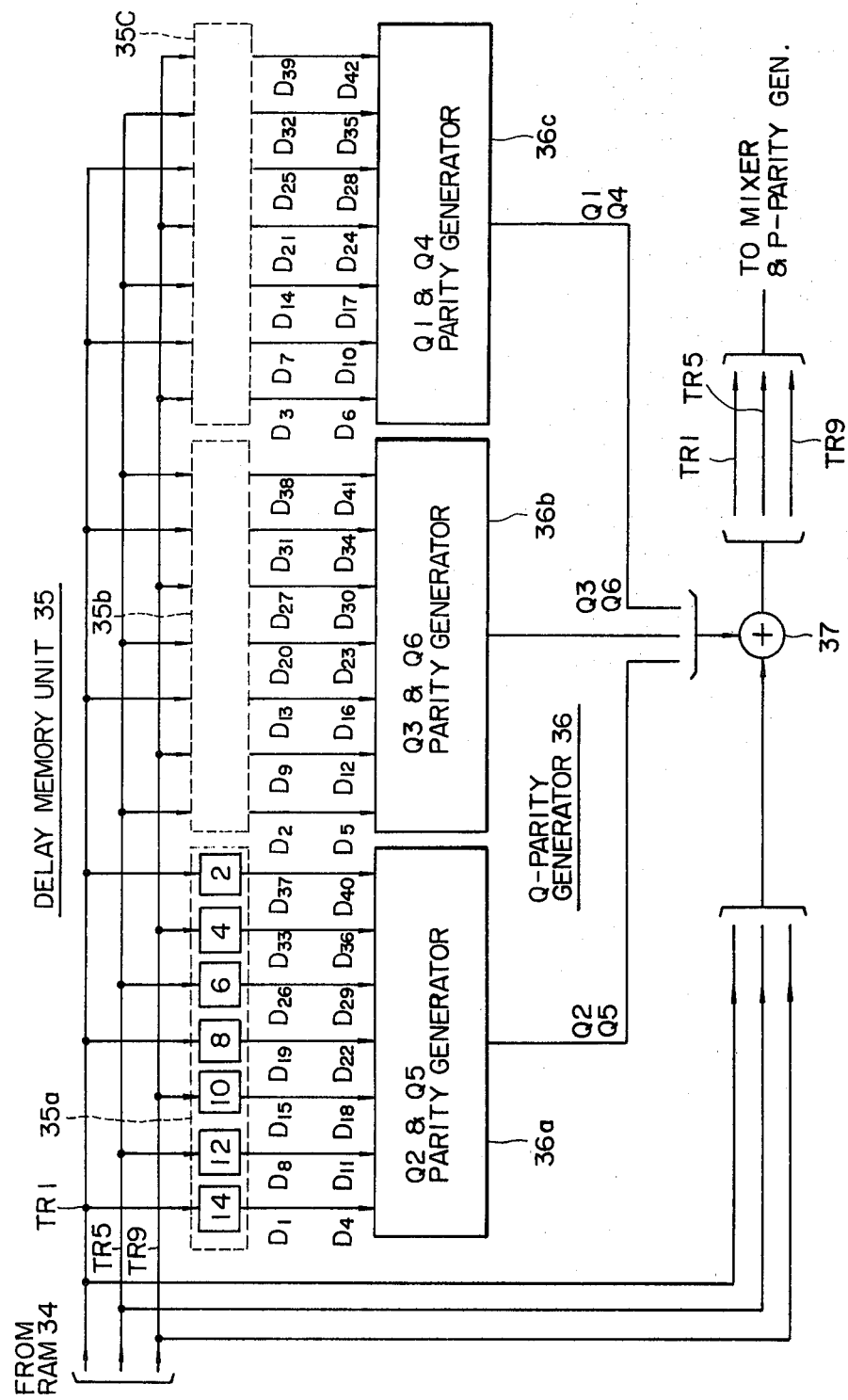
FIG. 7 is an illustration of the details of the delay memory unit and Q-parity generator of FIG. 6.

Referring to FIG. 7, delay memory unit 35 and Q-parity generator 36 are shown in detail. The delay memory unit 35 comprises three groups of digital memory delay elements 35a, 35b and 35c. Each memory group comprises seven delay elements with numerals in each block indicating the delay intervals in terms of frame. In delay memory 35a, the data words $d_1, d_4 \ldots d_{3n-2}$ associated with the #1 track is delayed by intervals of 14, 8 and 2 frames, the data words $d_2, d_5, \ldots d_{3n-1}$ associated with the #5 track are delayed by intervals of 12 and 6 frames, and similarly, the data words $d_3, d_6, \ldots d_{3n}$ associated with the #9 track are delayed by intervals of 10 and 4 frames. Thus, group data words $D_1, D_8, D_{15}, D_{19}, D_{26}, D_{33}, D_{37}$ are aligned in phase for Q-parity word $Q_2$. Likewise, group data words $D_4, D_{11}, D_{18}, D_{22}, D_{29}, D_{36}$ and $D_{40}$ are aligned in phase for Q-parity word $Q_5$ one frame after the phase alignment of the $Q_1$ group data words. The successive phase aligned group data words D are supplied to a Q2-Q5 parity generator 36a to generate $Q_2$ and $Q_5$ parity words by modulo-2 summation of the supplied data words D. The generated parity words $Q_2,Q_5$ are respectively inserted by mixing circuit 37 into frames #15 and #16 of the #5 track, respectively.

In like manner, delay element 35b provides phase alignment of group data words $D_2, D_9, D_{13}, D_{20}, D_{27}, D_{31}$ and $D_{38}$ for Q-parity word $Q_3$ and subsequent phase alignment of group data words $D_5, D_{12}, D_{16}, D_{30}, D_{34}$ and $D_{41}$ for Q-parity word $Q_6$. A Q3-Q6 parity generator 36b generates $Q_3$ and $Q_6$ parity words in succession to insert them respectively into the #15 and #16 frames. Delay element 35c provides phase alignment of group data words $D_3, D_7, D_{14}, D_{21}, D_{25}, D_{32}$ and $D_{39}$ for Q-parity word $Q_1$ and subsequently a phase alignment with respect to group data words $D_6, D_{10}, D_{17}, D_{24}, D_{28}, D_{35}$ and $D_{42}$ for Q-parity word $Q_4$. A Q1-Q4 parity generator generates $Q_1$ and $Q_4$ parity words in succession for insertion into the #15 and #16 frames of the #1 track.

Returning to FIG. 6, the outputs of mixing circuit 37 are supplied to a P-parity generator 38 and to a second mixing circuit 39, also responsive the outputs of P-parity generator 38. By means of this parity generator 38 the data word groups of each frame are modulo-2 summed together to derive P-parity check words $P_1$ to $P_{14}$ and the Q-parity word groups of each frame are modulo-2 summed together to derive P-parity words $P_{15}$ and $P_{16}$. The derived P-parity words are inserted into the data track #13. As in the previous embodiment, CRCC and frame sync codes S and S' are inserted by circuit 42 into the data and check words by means of a CRCC generator 40 and a frame sync generator 41, thereby completing a data block, the block of data being fed through the modulator to suitable recording heads.

The reproduced data from the demodulator is coupled to a jitter absorption memory 50 and to a sync separator 49 to eliminate jitter components. The output of memory 50 is supplied to a 1-frame delay memory 52 and to an error detection circuit 51 as in the first embodiment.

The delayed data from delay memory 52 is applied to an interpolation circuit 56 and to an error correction circuit 55 to which is also applied an error point indicating code from error detection circuit 51.

Figure 8:
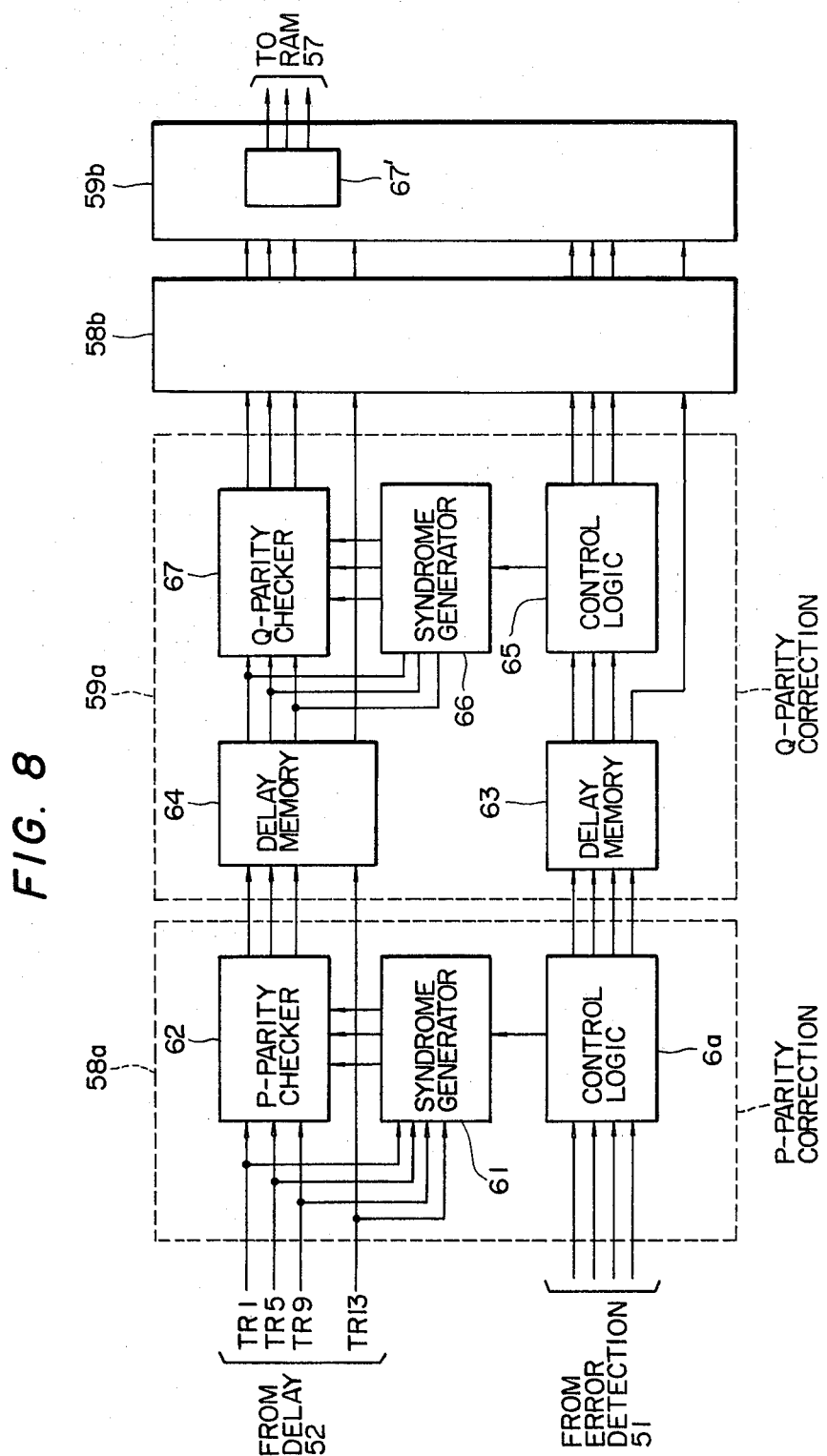
FIG. 8 is an illustration of the details of the error correction circuit of FIG. 6.

Details of the error correction circuit 55 are now described with reference to FIG. 8. Error correction circuit 55 generally comprises first and second P-parity correction circuits 58a and 58b and first and second Q-parity correction circuits 59a and 59b, with the first P-parity and Q-parity correction circuits 58a, 59a forming a first stage of P-Q parity correction and the second set of correction circuits 58b, 59b forming a subsequent stage to repeat the P-Q parity correction. Each P-parity correction circuit includes a control logic 60, a syndrome generator 61 and a P-parity checker 62. The logic 60 receives input data from the error detection circuit 51 which interprets the frame address code to detect when only one error has occurred in one of the group data words and instructs the syndrome generator 61 to select a corresponding one of the syndromes which it generates. Assume that data word $d_1$ of data word group $D_9$ is in error, in which case the syndrome generator 61 is instructed to select syndrome $Sp_{3(1)}$ from the following set of syndromes:

$$\left.\begin{aligned} D_1(d_1) \oplus D_2(d_1) \oplus D_3(d_1) \oplus P_1(p_1) &= Sp_{1(1)} \\ D_7(d_1) \oplus D_8(d_1) \oplus D_9(d_1) \oplus P_3(p_1) &= Sp_{3(1)} \\ &\vdots \\ D_{37}(d_1) \oplus D_{38}(d_1) \oplus D_{39}(d_1) \oplus P_{13}(p_1) &= Sp_{13(1)} \\ Q_1(q_1) \oplus Q_2(q_1) \oplus Q_3(q_1) \oplus P_{15}(p_1) &= Sp_{15(1)} \end{aligned}\right\} \quad (5)$$

The parity checker 62 provides the following modulo-2 addition and corrects the error data $D_9(d_1)$ by replacing it with $D_9(d_1)'$:

$$D_9(d_1) \oplus Sp_{3(1)} = D_9(d_1)' \quad (6)$$

If an additional error is detected in $D_{37}(d_1)$, for example, syndrome generator 61 is subsequently instructed to select a syndrome $Sp_{13(1)}$ from the generating syndromes given by Equation (5) to allow P-parity checker 62 to correct that error by the modulo-2 addition $D_{37}(d_1) \oplus Sp_{13(1)} = D_{37}(d_1)'$. In response to each correcting operation of parity checker 62, control logic 60 updates an error address map to erase the error address. When all the P-parity correctable errors have been corrected in parity checker 62, control logic 60 proceeds to transmit the map data to Q-parity correction circuit 59a.

Each Q-parity correction circuit comprises delay memories 63, 64, a control logic 65, a syndrome generator 66 and a Q-parity checker 67. The data corrected by P-parity checker 62 is applied to delay memory 64 and the data from the logic 60 is applied to delay memory 63. Delay memory 64 introduces various delays substantially identical to delay memory unit 35 so that the time serial data words are aligned in phase with the associated Q parity word. Delay memory 63 introduces a delay of 14-frame intervals to align the input map data in phase with the data words derived by Q-parity checker 67 and syndrome generator 66. Control logic 65 provides instructions to syndrome generator 66 when only one error exists in one group of Q-parity data words. If data word $D_9(d_1)$ is found to be in error, for example, syndrome generator 66 is instructed to select syndrome $Sq_{3(1)}$ from the following generating syndromes:

$$\begin{aligned}D_1(d_1) \oplus D_8(d_1) \oplus D_{15}(d_1) \oplus D_{19}(d_1) \oplus D_{26}(d_1) \\ \oplus D_{33}(d_1) \oplus D_{37}(d_1) \oplus Q_2(q_1) = Sq_{2(1)} \\ D_2(d_1) \oplus D_9(d_1) \oplus D_{13}(d_1) \oplus D_{20}(d_1) \oplus D_{27}(d_1) \\ \oplus D_{31}(d_1) \oplus D_{38}(d_1) \oplus Q_3(q_1) = Sq_{3(1)} \\ D_3(d_1) \oplus D_7(d_1) \oplus D_{14}(d_1) \oplus D_{21}(d_1) \oplus D_{25}(d_1) \\ \oplus D_{32}(d_1) \oplus D_{39}(d_1) \oplus Q_1(q_1) = Sq_{1(1)}\end{aligned} \quad (6)$$

Q-parity checker 67 then provides modulo-2 summation $D_9(d_1) \oplus Sq_{3(1)} = D_9(d_1)'$ and substitutes the latter into the data word in error. A similar correction takes place if there is an additional error in a data word which occurs subsequent to the previous data word. Control logic 65 updates its address map in response to each Q-parity correction. If one or more further errors are found to exist in the updated map which can be corrected by P-parity modulo-2 operation, control logic 65 transfers its map data to P-parity correction circuit 58b, so that the above correction process is repeated until all the errors that can be corrected by successive P- and Q-parity modulo-2 operations by syndromes are removed.

The above correcting operation is best understood by the following description with reference to FIG. 9 in which the data words of modulo-2 combination of $Q_1$, $Q_2$ and $Q_3$ parities are rearranged in a row-and-column pattern with each row data being associated with its Q-parity word. If six errors have occurred as marked in circle which illustrates one of the worst cases, P-parity correction first takes place with respect to data word $D_{37}$ since logic 60 disregards the erroneous parity word $P_{11}$. After P-parity correction of data word $D_{37}$, Q-parity correction circuit 59a comes into play to effect correction of data word $D_3$ and a subsequent data word $D_9$ since there is only one error in each row. After successive corrections of data words $D_3$ and $D_9$, P-parity correction circuit 58b is enabled to correct data word $D_1$ and subsequently data word $D_8$. Thus, most of possible errors can be corrected by repeated P- and Q-parity correcting operations.

However, if more than one error exists simultaneously in two rows and two columns as illustrated in FIG. 10, the above correction process cannot apply. In that event, error detection circuit 51 provides instructions to interpolation circuit 56 to correct such errors by interpolation as described in the previous embodiment.

Error corrected data trains are presented to a time expansion RAM 57 for purposes of eliminating the redundant bits and time-compressing the data words, as in the previous embodiment.

Since each of the Q-parity check words is derived from a combination of diagonally located data words, the recorded data is particularly impervious to burst type errors which tend to occur along the tape length.

The second embodiment of the invention allows the editing point to occur at the center of the 15th or 16th frame (the #1 or #2 frame of Q-parity field) to avoid loss of frame sync codes due to wow and flatter. Although this results in a loss of Q-parity field, the presence of the P-parity track ensures against a single error in each column data of that block. Since the loss of Q-parity occurs only in one data block of the edited tape, the error correcting capability of this coding approach is not substantially affected.

A modification of the data format of the second embodiment is illustrated in FIG. 11 in which data words are located in four tracks and P-parity words are located in a P-parity field recorded in a location following the data field and the Q-parity field is recorded in a location following the P-parity field. According to the algorithm of this modification, the P-parity and Q-parity words are derived by the following modulo-2 summations:

$$\left.\begin{aligned}P_1 &= D_4 \oplus D_{10} \oplus D_{19} \\ P_2 &= D_3 \oplus D_9 \oplus D_{20} \\ P_3 &= D_2 \oplus D_{12} \oplus D_{17} \\ P_4 &= D_1 \oplus D_{11} \oplus D_{18} \\ P_5 &= D_8 \oplus D_{14} \oplus D_{23} \\ P_6 &= D_7 \oplus D_{13} \oplus D_{24} \\ P_7 &= D_6 \oplus D_{16} \oplus D_{21} \\ P_8 &= D_5 \oplus D_{15} \oplus D_{22} \\ Q_1 &= D_1 \oplus D_{10} \oplus D_{17} \oplus P_2 \\ Q_2 &= D_2 \oplus D_9 \oplus D_{18} \oplus P_1 \\ Q_3 &= D_3 \oplus D_{12} \oplus D_{19} \oplus P_4 \\ Q_4 &= D_4 \oplus D_{11} \oplus D_{20} \oplus P_3 \\ Q_5 &= D_5 \oplus D_{14} \oplus D_{21} \oplus P_6 \\ Q_6 &= D_6 \oplus D_{13} \oplus D_{22} \oplus P_5 \\ Q_7 &= D_7 \oplus D_{16} \oplus D_{23} \oplus P_8 \\ Q_8 &= D_8 \oplus D_{15} \oplus D_{24} \oplus P_7\end{aligned}\right\} \quad (7)$$

It can be seen that a data block comprises 10 frames of six data frames, two P-parity frames and two Q-parity frames. Each P-parity word is derived from a combination of data words located in diagonal positions with the data words being displaced a distance of two frames in the longitudinal direction and displaced a distance of at least 2n tracks (where n is the number of tracks for each channel) so that there is no combination of data words which is aligned in the transverse or column direction. The Q-parity words are each derived from a combination of data words also located in diagonal positions with the data words of each track being displaced a distance of four frames.

FIG. 12 is a better illustration of the arrangement of words in a row-and-column pattern, with the rows indicating Q-parity words $Q_1$ to $Q_8$ and the columns indicating P-parity words $P_1$ to $P_8$. The P-parity words in parentheses are only associated with the Q-parity words indicated at the left of the pattern. It is seen therefore that errors uncorrectable by P- and Q-parity words occur if each of two or more P-parity columns contain two or more errors which also occur in the same Q-parity rows as previously described with reference to FIG. 10. In such event, interpolation correction is effected.

Electronic editing can be made at a Q-parity frame resulting in a loss of the Q-parity field. However, the P-parity words remain unaffected to assure P-parity correction.

FIG. 13 is an illustration of a practical embodiment of the modified device for formatting data. A delay memory 70 provides phase alignment of data words on four tracks by introducing delays of 2-, 4- and 6-frame intervals into the data words that form each P-parity word. A P-parity generator 71 generates a set of P-parity words $P_1$ to $P_4$ in the 7th frame position and a set of P-parity words $P_5$ to $P_8$ in the 8th frame position. The P-parity words are inserted into the data trains from the time compression memory by mixing circuit 72. The P-parity encoded data trains are fed into a second memory delay 73 which introduces delays as in delay memory 70. The phase aligned data and P-parity words are fed into a Q-parity generator 74 to generate Q-parity words $Q_1$ to $Q_4$ in the 9th frame position and Q-parity words $Q_5$ to $Q_8$ in the 10th frame position, which are then supplied to a mixing circuit 75 to be inserted into the data trains derived from the mixing circuit 72.

What is claimed is:

1. A method of processing data words comprising the steps of organizing the data words into successive patterns of rows and columns, deriving a plurality of first parity words from columnwise data words of each pattern, arranging the first parity words in a row parallel to the rows of data words, deriving a plurality of second parity words from diagonally arranged data words of each pattern, arranging the second parity words in a pattern of rows and columns in succession to the pattern of data words, generating a check code word, and appending the check code word to each row of said data and first and second parity words for enabling detection of errors in each row.

2. A method as claimed in claim 1, further comprising the step of generating a synchronization word and appending it to the beginning of words of each row of each pattern.

3. A method as claimed in claim 1 or 2, wherein the words of each row are recorded on separate tracks of a recording medium.

4. Apparatus for processing data words comprising means for organizing the data words into successive patterns of rows and columns, means for deriving a plurality of first parity words from columnwise data words of each pattern and arranging the first parity words in a row parallel to the rows of data words, means for deriving a plurality of second parity words from diagonally arranged data words of each pattern and arranging the second parity words in a pattern of rows and columns in succession to each pattern of data words, and means for generating a check code word and appending it to each row of said data and first and second parity words for enabling detection of errors in each row.

5. Apparatus as claimed in claim 4, further comprising means for generating a synchronization word and appending it to the beginning of each row of words of each pattern.

6. Apparatus as claimed in claim 4 or 5, further comprising means for recording the words of each row on separate tracks of a recording medium.

7. A method of processing data blocks so that clustered errors in data bits derived from parallel data tracks can be detected, wherein the bits from different locations along the length of the tracks are sequentially derived, comprising arranging the sequentially derived data bits in a storage matrix of rows and columns so that data bits derived at like times from the parallel tracks are aligned in the same columns and sequential data bits derived from the same track are arranged sequentially in different columns in the same row, data bits derived at different times and from the different tracks being respectively arranged in different columns and rows, deriving a first parity bit field, each parity bit of the first parity bit field being formed by combining data bits from a plurality of the rows and a plurality of the columns such that each parity bit is responsive to a data bit in only one of said columns, the number of rows in the first field being equal to the number of rows in the matrix, the parity bits of the first parity field being formed such that every one of said data bits contributes to one and only one parity bit of the first field and the same number of data bits contributes to each parity bit of the first field.

8. The method of claim 7 wherein the first parity field includes N columns and M rows derived from the data bits and the matrix includes P columns and M rows of data bits, where each of M, N and P is an integer greater than one, the parity bit at column j, row i of the first parity field being derived by combining one data bit from each of columns $N-M+j$, $N-2M+j$, $N-3M+j$ ... j, such that lines drawn through entries in the matrix of the data bits forming the parity bit at column j, row i are parallel to each other and terminate at the parity bit at column j, row i, where k is selectively every column in the first parity field and i is selectively every one of the M rows.

9. The method of claim 8 wherein a second parity field having N columns is included, the bit at column r, row s of the second parity field being derived by combining the parity bit at column r, row t of the first parity field and the data bits combined to form the parity bit at column r, row t being such that a line drawn from the entry at column r, row s of the first parity field to the entry at column r, row t of the second parity field is parallel to the lines in the matrix of the data bits forming the parity bit at column r, row t of the first parity field, where r is selectively every one of the N columns; and s and t are selectively every one of the M rows.

10. The method of claim 7 or 8 wherein column u of the matrix includes a parity bit derived by combining the data bits from all of the rows containing data bits of column u, and column v of the first parity field includes a parity bit derived by combining the data bits from all of the rows containing parity bits of column v, where u is selectively every row of the block containing data bits and v is selectively every row of the first parity field.

11. Apparatus for processing data blocks so that clustered errors in data bits derived from parallel data tracks can be detected comprising means for reading the parallel data tracks so the bits from different locations along the length of the tracks are sequentially derived and bits from the same locations of the different tracks are simultaneously derived in parallel, a storage matrix responsive to the bits of the read data tracks, means for arranging the sequentially derived data bits in rows and columns of the storage matrix so that data bits derived at like times from the parallel tracks are aligned in the same columns and sequential data bits derived from the same track are arranged sequentially in different columns in the same row, data bits derived at different times and from the different tracks being respectively arranged in different columns and rows, means responsive to the data bits stored in the matrix for deriving a first parity bit field, said last named means including means for combining data bits from a plurality of the rows and a plurality of the columns such that each parity bit of the first parity bit field is responsive to a data bit in only one of said columns, the number of rows in the first field being equal to the number of rows in the matrix, the parity bits of the first parity field being formed such that every one of said data bits contributes to one and only one parity bit of the first field, and the same number of data bits contributes to each parity bit of the first field.

12. The apparatus of claim 11 wherein the first parity field includes N columns and M rows derived from the data bits and the matrix includes P columns and M rows of data bits, where each of M, N and P is an integer greater than one, the combining means including means for deriving the parity bit at column j, row i of the first parity field by combining one data bit from each of columns $N-M+j$, $N-2M+j$, $N-3M+j$ ... j, such that lines drawn through entries in the matrix of the data bits forming the parity bit at column j, row i are parallel to each other and terminate at the parity bit at column j, row i, where k is selectively every column in the first parity field and i is selectively every one of the M rows.

13. The apparatus of claim 12 wherein the matrix includes a second parity field having N columns, the combining means including means for combining the parity bit at column r, row t of the first parity field and means for combining selected ones of the data bits to form the parity bit at column r, row t, the selected data bits being selected such that a line drawn from the entry at column r, row s of the first parity field is parallel to the lines in the matrix of the data bits forming the parity bit at column r, row t of the first parity field, where r is selectively every one of the N columns; and s and t are selectively every one of the M rows.

14. The apparatus of claim 11 or 12 wherein each of columns u and v of the matrix includes a parity bit, the combining means including: means for combining the data bits from all of the rows containing data bits of column u to form the parity bit of column u, and means for combining the data bits from all of the rows containing parity bits of column v to form the parity bit of column v, where u is selectively every row of the block containing data bits and v is selectively every row of the first parity field.

* * * * *